United States Patent [19]

Tsuzuki

[11] Patent Number: 4,791,368
[45] Date of Patent: Dec. 13, 1988

[54] AUTOMATIC MAGNETIC FIELD MEASURING APPARATUS USING NMR PRINCIPLES

[75] Inventor: Naohisa Tsuzuki, Tokyo, Japan

[73] Assignee: Kabushiki Kaisha Toshiba, Kawasaki, Japan

[21] Appl. No.: 27,430

[22] Filed: Mar. 18, 1987

[30] Foreign Application Priority Data

Mar. 24, 1986 [JP] Japan .................................. 61-65492

[51] Int. Cl.$^4$ ............................................ G01R 33/24
[52] U.S. Cl. .................................................... 324/301
[58] Field of Search ............... 324/301, 302, 225, 226, 324/244, 313, 314, 320

[56] References Cited

PUBLICATIONS

Toyota, Electronic Measurement, Chapter 4, Section 4.9.1.e "Nuclear Magnetic Resonance"; 1966; (Figure 4.100).

Primary Examiner—Stewart J. Levy
Assistant Examiner—Lawrence G. Fess
Attorney, Agent, or Firm—Banner, Birch, McKie & Beckett

[57] ABSTRACT

An external magnetic field is first measured with a certain degree of accuracy using an ancillary (for example, Hall effect) magnetic field measurement device. This measured value is used to calculate an estimate of the nuclear magnetic resonance frequency of a substance placed in the magnetic field. Thereafter, the magnetic field is more accurately determined by varying a bias magnetic field over a range and measuring the variation of the inductance characteristics of a high-frequency coil surrounding the substance which is transmitting at the estimated NMR resonance frequency. By strategically choosing the range of values of bias coil current which produce the bias magnetic field, the invention repeatedly narrows the range in which the magnetic resonance effect can occur so as to derive successively more accurate estimations of the bias coil current occurring at the resonance point, until a predetermined accuracy is attained. The result of the magnetic field measurement is computed from the estimated NMR frequency and the resonance point current, and is rapidly displayed.

10 Claims, 8 Drawing Sheets

AUTOMATIC MAGNETIC FIELD MEASURING APPARATUS USING NMR PRINCIPLES

BACKGROUND OF THE INVENTION

1. Field of the Invention

This invention relates to a magnetic field measuring apparatus, and in particular to a magnetic field measuring apparatus that utilizes the nuclear magnetic resonance effect to measure a magnetic field with high accuracy.

2. Description of the Related Art

There are many methods of measuring a magnetic field. One method which is widely used now is the method using the Hall effect. As is well known, the Hall effect is a phenomenon that when a magnetic field is added perpendicularly to the surface of a substance of very high electron mobility (for example, indium arsenide (InAs)), and a constant current is supplied in a direction perpendicular to the magnetic field, a voltage is generated which is proportional to the magnitude of the magnetic field and the magnitude of the current in a direction perpendicular to both the magnetic field and the current.

The magnitude of a magnetic field can easily be measured using the Hall effect by supplying a current and then measuring the resultant voltage (which is proportional to the magnetic field). However, the accuracy of measurement is about 0.1% at best, and if higher accuracy is required, this method cannot be used.

To measure with higher accuracy, measuring devices utilizing the nuclear magnetic resonance effect (hereinbelow abbreviated as NMR) are therefore used. A detailed explanation of NMR will be omitted because it is given in documents such as "Introduction to Solid State Physics" by Charles Kittel (John Wiley & Sons, Inc., New York). However, NMR can be summarized in relevant part as follows.

A static magnetic field is added to certain kinds of substance (for example, water). Also applied is a high-frequency magnetic field of a particular frequency which is chosen based on the characteristics of the substance, and which frequency is also in proper proportion to the static magnetic field. When the frequency is properly chosen, the magnetic properties of the substance change due to a resonance effect at the atomic level. This change in magnetic properties can be detected as a change in the inductance of the coil generating the high-frequency magnetic field.

An example of an NMR magnetic field measuring apparatus utilizing this phenomenon is shown in FIG. 10. As shown in this figure, this measuring apparatus comprises a main part 10 and a probe part 20. Main part 10 comprises a high-frequency oscillator circuit 11, a detecting amplifier circuit 12, a low-frequency oscillator circuit 13, and a cathode-ray tube 14. Probe part 20 comprises a magnetic resonance substance 21 (such as water sealed into an insulating container), a high frequency coil 22 wound around the outside thereof, and bias magnetic field coils 23, 24 for generating a bias magnetic field $B_I$ that is superimposed on the external magnetic field $B_e$ that is to be measured.

The following general relationship exists between the total magnetic field B that is present in the magnetic resonance substance 21, and the frequency $f_R$ of the high-frequency magnetic field that creates the nuclear magnetic resonance:

$$B = A \times f_R \tag{1}$$

where A is a known constant depending on the substance which can be found in reference literature, and $$B = B_e + B_I \tag{2}$$

The inductance of the high-frequency coil is different at this resonant frequency than at other frequencies. A resonance circuit comprising high-frequency oscillator circuit 11 and detecting amplifier circuit 12 detects resonance because of this variation of inductance. The voltage across the coil 22 is detected and amplified by detecting amplifier circuit 12 and is applied as $e_v$ to the vertical direction deflecting electrode of cathode ray tube 14. A ramp waveform current I output from low-frequency oscillator circuit 13 is fed to bias magnetic field coils 23 and 24, and a voltage $e_h$ proportional to I is generated by using a resistor. This voltage $e_h$ is applied to the horizonal deflecting electrode of cathode ray tube 14.

These waveforms of $B_I$, $e_h$ and $e_v$ are shown in FIG. 11. It can be seen that resonance occurs when $B_I = B_{IR}$. This gives rise to resonance waveforms of $e_v$. Because $e_h$ is proportional to $B_I$, the resonance points within the $e_v$ waveform are synchronized with the ramp waveform of $e_h$. The resonance waveforms are therefore displayed at fixed positions on the screen of cathode ray tube 14. The value $B_{IR}$ at which bias magnetic field $B_I$ causes resonance can be determined from the horizontal position (phases) of these resonance waveforms.

Therefore the external magnetic field $B_e$ that is to be measured can be calculated by substituting $B_I = B_{IR}$ into equation (2) to derive the relation:

$$B_e = A \times f_R - B_{IR} \tag{3}$$

In the measuring apparatus constructed as above, normally the range in amplitude of the output of the low-frequency oscillator 13 (i.e. the amplitude of variation of bias magnetic field $B_I$) is constant, so the range of magnitudes of the external magnetic field $B_e$ that can be measured is the same as the range over which it is possible to vary this bias magnetic field $B_I$. If it is required to measure $B_e$ over a wide range, one must perform a modification of circuit constants of the resonance circuit comprising elements 11 and 12 to change the approximation to resonant frequency $f_R$ produced by high-frequency oscillator circuit 11. Unless the value of external magnetic field $B_e$ can be predicted beforehand to some extent, this modification has to be conducted by trial and error to find a resonant frequency $f_R$ for which resonance waveforms are displayed on the cathode ray tube 14.

Furthermore, in order to measure using this measuring apparatus with high accuracy, the accuracy of the oscillation frequency of high-frequency oscillator circuit 11 must be increased, the range of output amplitude of low-frequency oscillator circuit 13 must be decreased, and the gain of the signal circuit which applies signal $e_h$ to the horizontal deflecting electrode of the cathode ray tube 14 must be increased. Disadvantageously, if the output amplitude of low-frequency oscillator circuit 13 is reduced, the range of the magnetic field which can be measured becomes small, increasing the complexity of the oscillation frequency modification. Thus, although the known measuring apparatus shown in FIG. 10 can measure magnetic fields with considerable accuracy, it has the disadvantage that time-consuming adjustment operations are required in order to obtain the measured magnetic field value.

SUMMARY OF THE INVENTION

An object of the present invention is to provide a magnetic field measuring apparatus whereby measurement can be performed with high accuracy and with simple operation, and with which the measured magnetic field value can be obtained in a short time.

According to the present invention, an external magnetic field that is required to be measured is measured using an ancillary magnetic field measuring means. In accordance with this measured value of the magnetic field, a frequency computing means computes a frequency at which a magnetic resonance substance around which a high-frequency coil is wound should exhibit resonance. The invention uses a high frequency generating means to generate a voltage having this frequency, which voltage is then applied to the high-frequency coil. If nuclear magnetic resonance then occurs, the inductance of the high-frequency coil will vary, and this variation will be sensed by a resonance point sensing means.

However, due to errors of measurement of the ancillary magnetic field measuring means and errors in the high frequency generating means, nuclear magnetic resonance will not necessarily occur. Accordingly, a bias current is supplied to a bias coil through a bias coil current generating means so as to vary within a very narrow range the magnetic field that is applied by the bias coil. As the magnetic field is thus varied, nuclear magnetic resonance is produced at a certain value of the bias coil current, causing a change in inductance of the high-frequency coil, which is sensed by the resonance point sensing means. The external magnetic field which is to be measured is then computed by a magnetic field computing means, from the value of the bias current of the bias coil and the frequency of the high-frequency voltage that is generated by the high-frequency generating means. The result of this computation is then output and displayed by a display output means, thereby measuring the magnetic field quickly, automatically, and with high accuracy.

BRIEF DESCRIPTION OF THE DRAWING

The present invention is better understood with reference to the following description and drawings, in which.

DESCRIPTION OF THE PREFERRED EMBODIMENT

Figure 1:
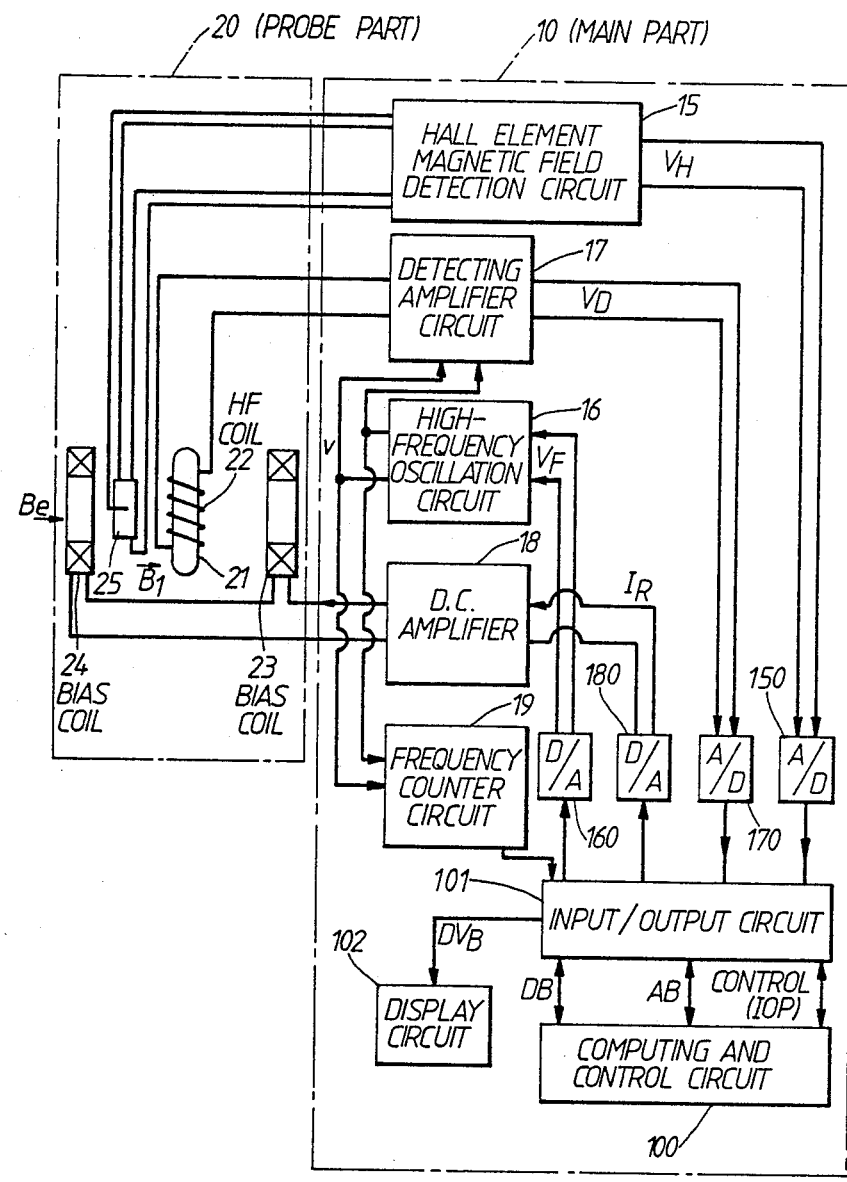
FIG. 1 is a block diagram of an embodiment of a magnetic field measurement apparatus according to the present invention.

FIG. 1 is a block diagram of an embodiment of a magnetic field measuring apparatus according to present invention.

Probe part 20 comprises a magnetic resonance substance 21, a high-frequency magnetic field coil 22 wound around the resonance substance 21, two bias coils 23, 24 placed on either side of the high-frequency magnetic field coil 22, and a Hall element 25 arranged near high-frequency magnetic field coil 22. Main part 10 of the measuring apparatus comprises: a Hall element magnetic field detector circuit 15, a detecting amplified circuit 17, a high-frequency oscillator circuit 16, a D.C. amplifier 18, a frequency counter circuit 19, an analog-digital converter 150, an analog-digital converter 170, a digital-analog converter 160, a digital-analog converter 180, an input/output circuit 101, a computing and control circuit 100, and a display circuit 102.

Hall element magnetic field detector 15 supplies a constant current to Hall element 25, and inputs the Hall voltage output from Hall element 25. High-frequency oscillator circuit 16 supplies high-frequency current to high-frequency magnetic field coil 22 through detecting amplifier circuit 17. D.C. amplifier 18 supplies bias magnetic field coil current I to series-connected bias magnetic field coils 23 and 24. Frequency counter circuit 19 measures the frequency of the output of high-frequency oscillator circuit 16. Analog-digital converter 150 carries out an analog-digital conversion (abbreviated as A/D) on the magnetic field measurement signal $V_H$ of Hall element magnetic field detector circuit 15. Analog-digital converter 170 carries out an analog-digital conversion on the detected output signal $V_D$ of detecting amplifier circuit 17. Digital-analog converter 160 converts the high-frequency oscillation frequency that is output through an input/output circuit 101 from a computing and control circuit 100 to a frequency reference signal $V_F$ in analog form, and supplies this signal $V_F$ to high-frequency oscillator circuit 16. Digital-analog converter 180 converts the current value of the bias magnetic field coil current I that is output from computing and control circuit 100 through input/output circuit 101 to D.C. amplifier 18 into a bias magnetic field current reference value $I_R$ in the form of an analog signal. Display circuit 102 displays the magnetic field measured value $DV_B$ that is output from computing and control circuit 100 through input/output circuit 101.

The operation of these circuits will be described in detail as follows.

Figure 2:
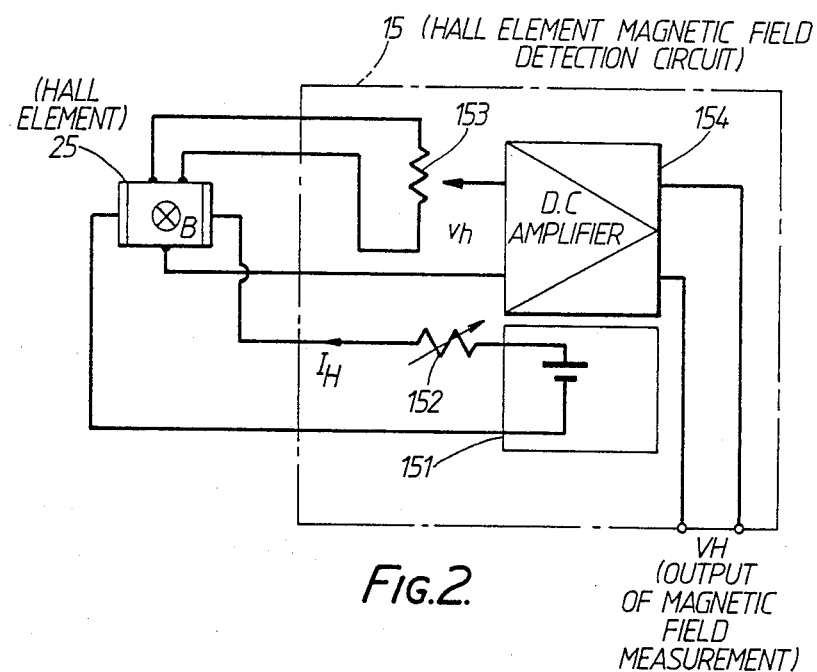
FIG. 2 is a circuit diagram of a Hall element magnetic field detection circuit and a Hall element presented in block form as elements 15 and 25 of the FIG. 1 embodiment of present invention.

FIG. 2 shows the relationship between Hall element 25 and Hall element magnetic field detector circuit 15. Hall element current $I_H$ is supplied to the two opposite sides of Hall element 25 through series resistor 152 from D.C. power source 151 that is one of the internal elements of Hall element magnetic field detector circuit 15. If Hall element 25 is arranged so that the magnetic field B that is applied to Hall element 25 from outside is applied in the direction perpendicular to the plane of the drawing, Hall voltage $v_h$ is generated between the opposite sides in the direction perpendicular to current $I_H$. Voltage $v_h$ generated by the Hall element is amplified by D.C. amplifier 154 to obtain a magnetic field measurement output $V_H$.

When no magnetic field is applied, the voltage $v_h$ is adjusted to zero by a zero-adjustment resistor 153 mounted on one of the voltage-generating sides of the Hall element 25. During the initial measurement for producing $V_H$, the value of $I_R$ (described more fully below) is ideally set to zero so as not to cause any bias magnetic field to corrupt the initial measurement of the external field by Hall element magnetic field detection circuit 15. However, the accuracy of this detection circuit 17 is, in many practical situations, so low that the small contribution which the bias magnetic field makes to the total magnetic field does not substantially corrupt the initial measurement of $V_H$. It is therefore not absolutely essential that $I_R$ be set to zero during the initial measurement of $V_H$.

Figure 3:
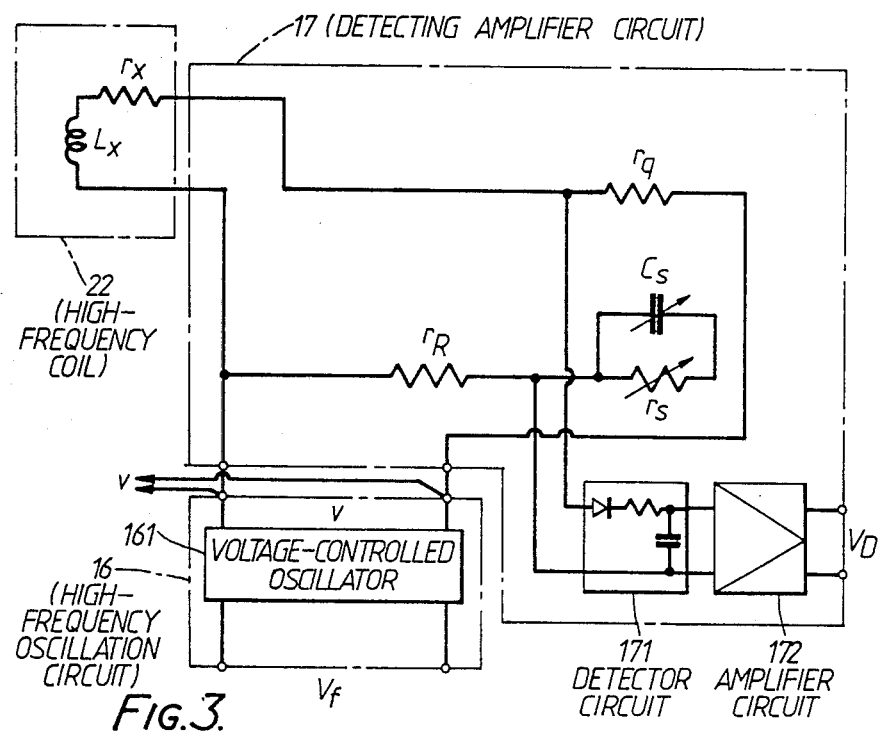
FIG. 3 is a circuit diagram of a detecting amplifier circuit, high frequency coil, and high-frequency oscillator circuit presented in block form as elements 17, 22 and 16 of the FIG. 1 embodiment of present invention.

FIG. 3 shows the internal circuitry of high-frequency oscillator circuit 16, detecting amplifier circuit 17 and high-frequency coil 22. High-frequency oscillator 16 is made up of a voltage controlled oscillator 161 which outputs a voltage v of frequency proportional to analog frequency reference signal $V_F$ output from D/A converter 160 (FIG. 1). A resistor $r_R$ and resistor $r_q$ are connected at the two ends of a series of circuit of inductance $L_x$ of high-frequency coil 22 and a resistor $r_x$. A parallel circuit of a resistor $r_s$ and capacitor $C_s$ is connected to the other sides of $r_R$ and $r_q$. Thus a bridge circuit is made up by $r_R$, $r_q$, $L_x$, $r_x$, $C_s$ and $r_s$.

v is applied across the point of connection of high-frequency coil 22 and $r_R$ and the point of connection of $r_q$ and the parallel circuit of $C_s$ and $r_s$. The output voltage generated between the point of connection of high-frequency coil 22 and $r_q$, and the point of connection of $r_R$ and $C_s$ is detected by a detector circuit 171 made up of a series connection of a rectifier and an R-C lowpass filter. The output of the filter is input to an amplifier circuit 172. The output of amplifier circuit 172 is output $V_D$ of detecting amplifier circuit 17.

D.C. amplifier 18 is a component which is commonly used in the art, and need not be discussed in greater detail than above.

Figure 4:
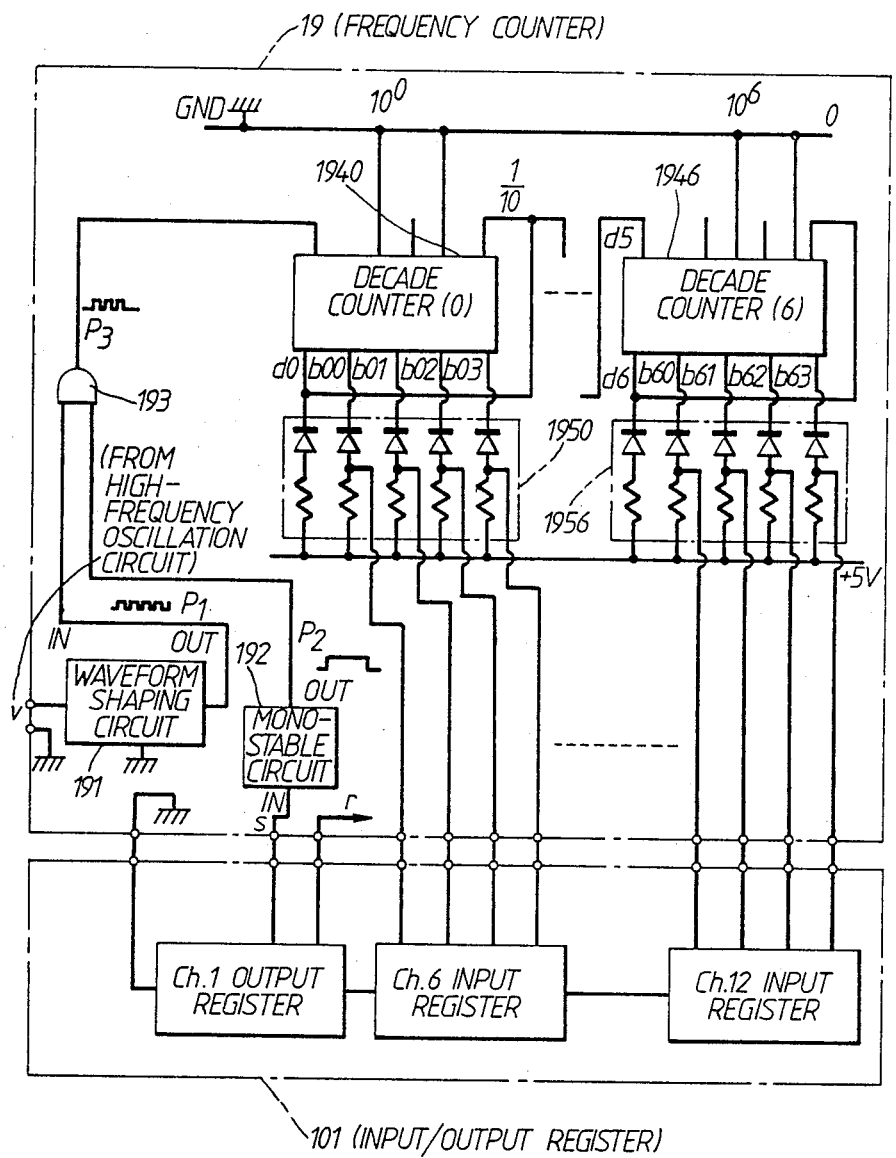
FIG. 4 is a circuit diagram of a frequency counter circuit presented in block form as element 19 of the FIG. 1 embodiment of present invention.

FIG. 4 is a circuit diagram of frequency counter 19. A waveform shaping circuit 191 inputs high-frequency voltage v from high-frequency oscillation circuit 16 (FIGS. 1 and 3), and outputs a pulse train $P_1$ of the same frequency as v. When a monostable circuit 192 inputs a trigger pulse (a count start signal s from input/output circuit 101), it outputs a pulse signal $P_2$ for a certain time $T_m$. $P_1$ and $P_2$ are input to AND gate 193 so that pulse train $P_1$ entering during this period $T_m$ is output as output $P_3$ of AND gate 193. $P_3$ is input to decade counter 1940, which counts the number of pulses. The count of the decade counter 1940 is obtained by a decade count output circuit 1950 as 4 bit signals b00 through b03 giving the numerical values 0 to 9. A carry signal d0 is output as a signal pulse from decade counter 1940 every time the count passes 10.

This carry signal is input to a decade counter 1941 (not explicitly shown in FIG. 4). As indicated in FIG. 4, seven decade counters 1940 to 1946 are cascaded, with the carry signal of each being successively input to the next decade counter, and the count of the pulse train $P_3$ can be represented with 7 decimal numbers (i.e., from decimal place 10 to decimal place $10^6$).

Although reset signal r is not explicitly shown in FIG. 4 as being connected to counters 1940 . . . 1946, before the $P_3$ pulse train is input to decade counter 1940, the counters 1940 through 1946 are reset by reset signal r from input/output circuit 101 so as to clear the count value. The count values b00 through b03—b60 through b63 of decade counters 1940 to 1946 are input to input/output circuit 101 through respective count output circuits 1950 through 1956.

Figure 5:
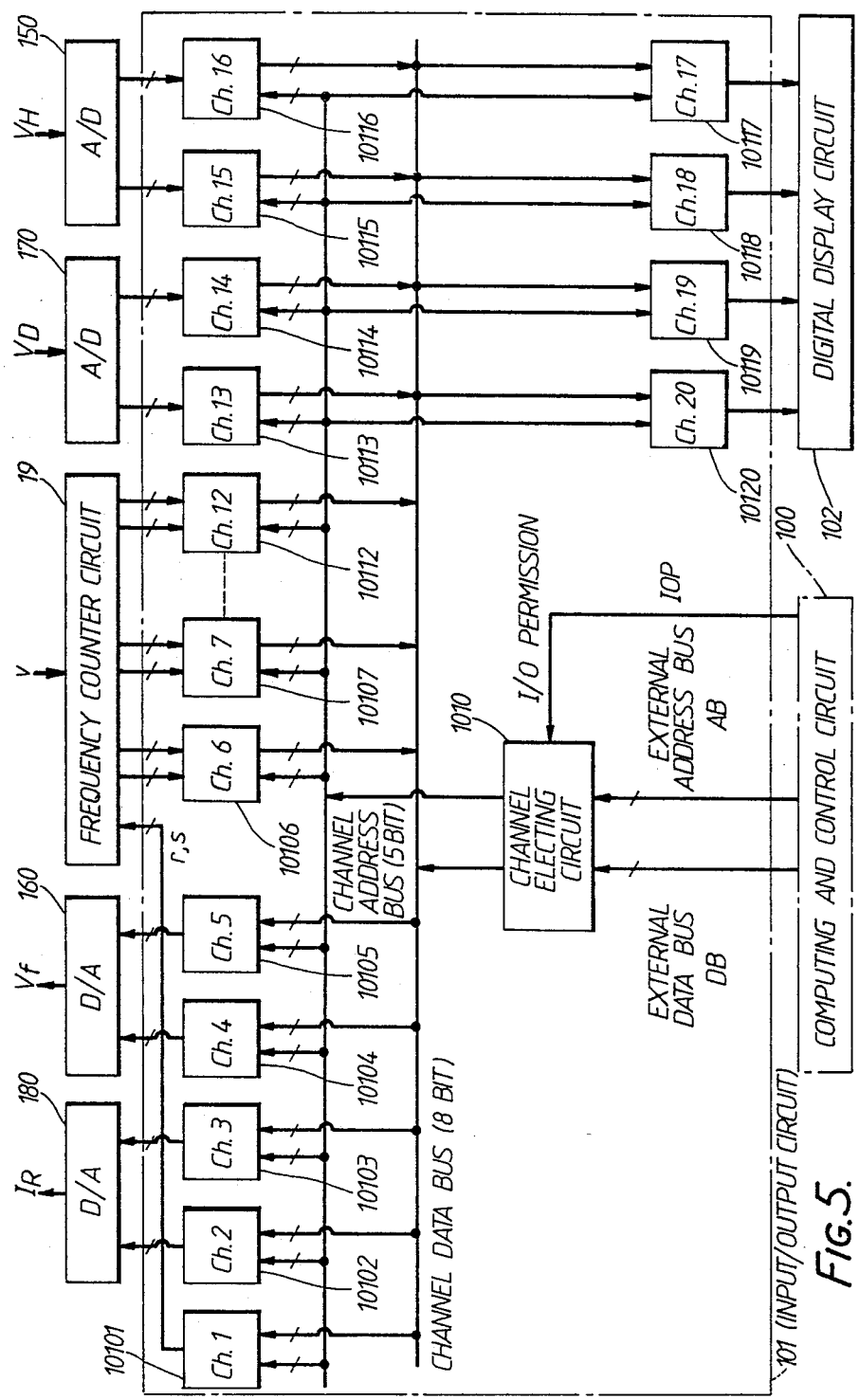
FIG. 5 is a circuit diagram of an input/output circuit presented in block form as element 101 of the FIG. 1 embodiment of present invention.

FIG. 5 is a circuit diagram of input/output circuit 101. The aforementioned frequency count (28 bits) from frequency counter circuit 19 (FIG. 4) is input to input channel registers 10106 to 10112, each of which are 8-bit registers. Each of the signals resulting from the analog-digital conversion of $V_D$ and $V_H$ are input to input channel registers 10113 to 10116, each of which are likewise 8-bit registers. Digital-analog conversion is performed by D/A converters 180 and 160 to obtain $I_R$ and $V_F$, respectively. The 16 bits comprising each digital signal corresponding to $I_R$ and $V_F$ are output to the D/A converters from 8-bit output channel registers 10102 to 10105. Using 2 bits, reset signal r and count start signal s are output to frequency counter 19 from 8-bit output channel 10101. A magnetic field measurement indication which has 8 decimal places and 32 bits is output to digital display circuit 102 through 8-bit output channel registers 10117 to 10120.

The selection of which input/output channel registers 10101 to 10120 to use for input/output of 8-bit data is controlled by signals sent out from a channel select circuit 1010 via a 5-bit channel address bus. Using 8-bit external data bus DB, 16-bit external address bus AB and 1-bit input/output permitting signal IOP of computing and control circuit 100, channel select circuit 1010 generates the various 5-bit signals of the channel addresses from external address bus AB, and connects the 8-bit input/output data of the particular channel register to external data bus DB only when IOP is ON.

The input channel registers of the input/output channel registers 10101 through 10120 output 8-bit input data onto the channel data bus only when the channel number of the particular input/output channel in question is specified by the 5-bit channel address which is input to the channel registers via the channel address bus. The output channel registers output 8-bit data to the outside of the entire input/output circuit 101 from the channel data bus only when the channel number of the particular input/output channel in question is specified by the 5-bit channel address which is input to the channel registers via the channel address bus.

Figure 6:
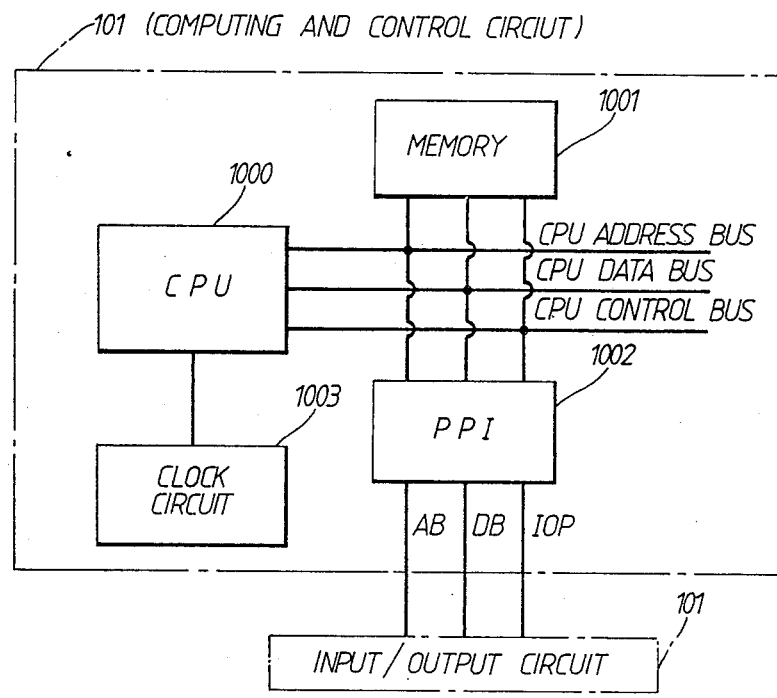
FIG. 6 is a circuit diagram of a computing and control circuit presented in block form as element 100 of the FIG. 1 embodiment of the present invention.

FIG. 6 is a diagram of computing and control circuit 100. The arrangement is such that a memory 1001 and programmable peripheral interface (abbreviated as PPI) 1002 are mutually connected to a microprocessor 1000 (abbreviated as CPU) through an 8-bit CPU data bus, 16-bit CPU address bus, and 16-bit CPU control bus. A clock signal that determines the CPU operating cycle is given to the CPU from a clock circuit 1003 The CPU 1000, memory 1001, PPI 1002 and clock circuit 1003 are of widely used types manufactured as one or more integrated circuits. The program that controls the operation of this computing and control circuit 100 is stored in memory 1001. The external address bus AB, the external data bus DB, and input/output permission signal IOP are connected to the CPU data bus, CPU address bus, and CPU control bus, respectively, through programmable peripheral interface PPI 1002, in a manner well-known in the art.

Figure 7:
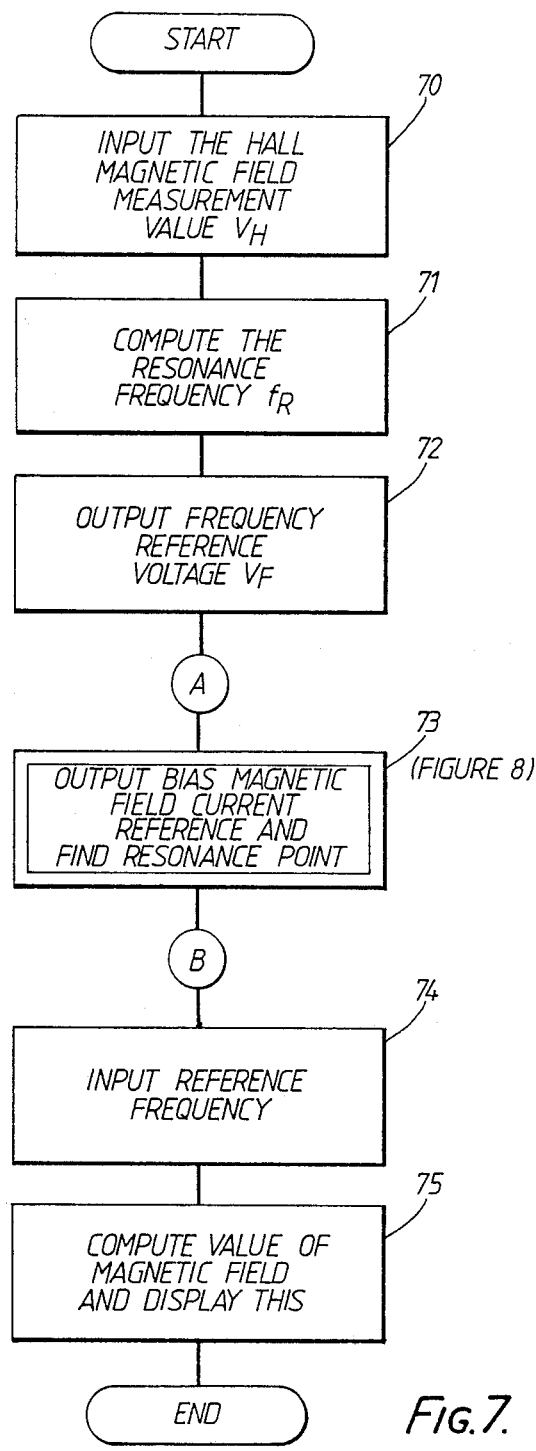
FIG. 7 is a flow chart showing the operation of the computing and control circuit 100 (FIGS. 1 and 6) of the present invention.

The operation of the invention will be explained as follows, with reference to the software resident in memory 1001 (FIG. 6). FIG. 7 is a flow-chart showing the operation of computing and control circuit 100.

First of all, in step 70, the Hall magnetic field measurement value $V_H$ is input to computing and control circuit 100 through A/D converter 150 and input/output circuit 101.

The first estimate of resonant frequency $f_R$ is computed in step 71 as follows. The magnetic field value $B_H$ corresponding to this $V_H$ is computed by a simple proportional calculation as follows:

$$B_H = a \times V_H \tag{4}$$

where a is a constant depending on the characteristics of Hall element 25 and amplifier 154, and may be determined, for example, by calibration.

The reference frequency (approximating the resonant frequency) $f_R$ corresponding to $B_H$ is computed as follows from equation (1):

$$f_R = (1/A) \times B_H \tag{5}$$

From equation (4) and equation (5), we have:

$$f_R = (a/A) \times V_H \tag{6}$$

In the next step, step 72, frequency reference voltage $V_F$ that is necessary for output of frequency $f_R$ from high-frequency oscillator circuit 16 is output through input/output circuit 101 and D/A converter 160 to high-frequency oscillation circuit 16 (FIG. 1). High-frequency voltage of frequency $f_R$ is therefore applied from high-frequency oscillator circuit 16 through detecting amplifier circuit 17 to high-frequency coil 22.

Figure 8:
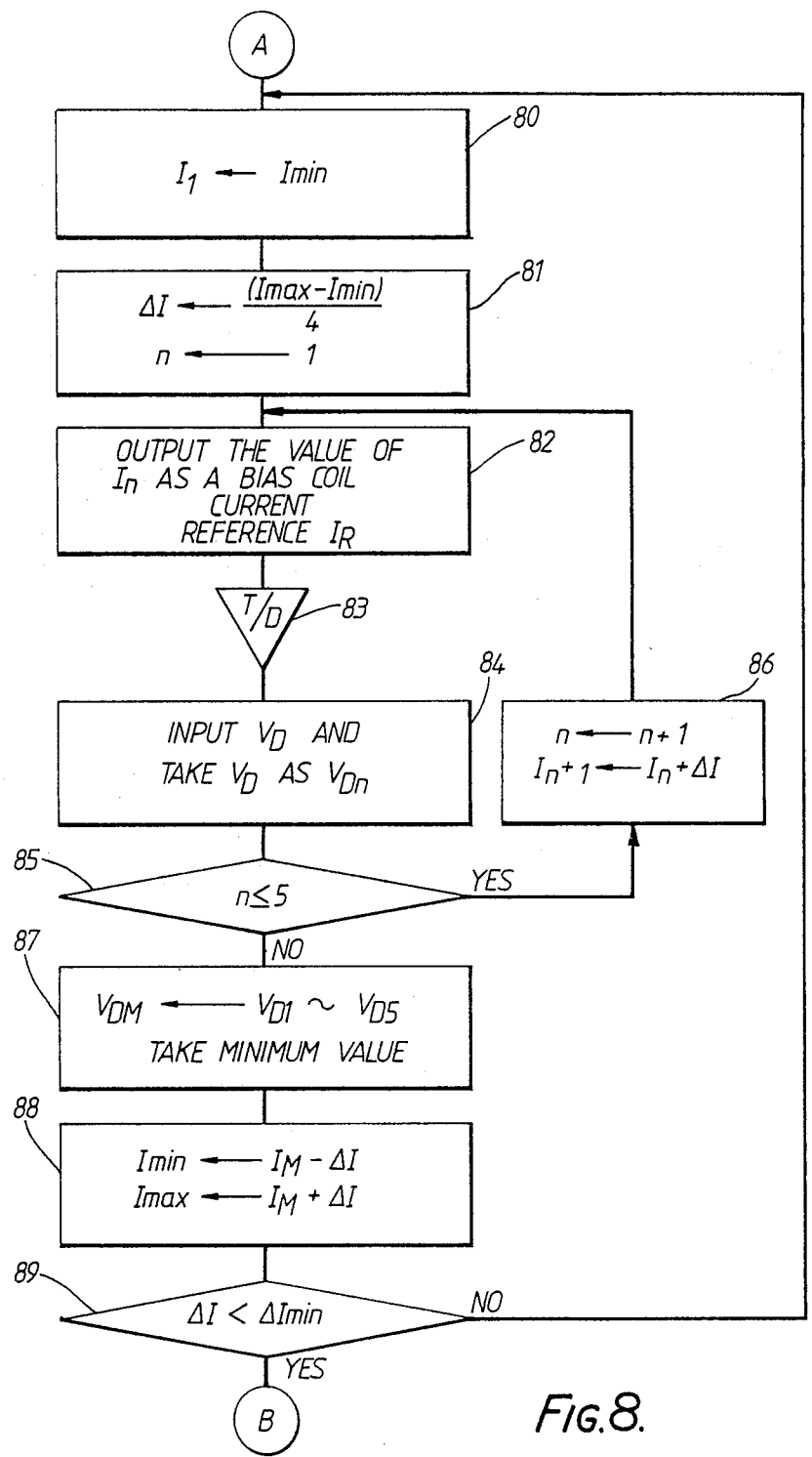
FIG. 8 is a flow-chart showing the operation of detection of magnetic resonance of the FIG. 1 embodiment of present invention in more detail than was presented in block 73 (FIG. 7).
Figure 10:
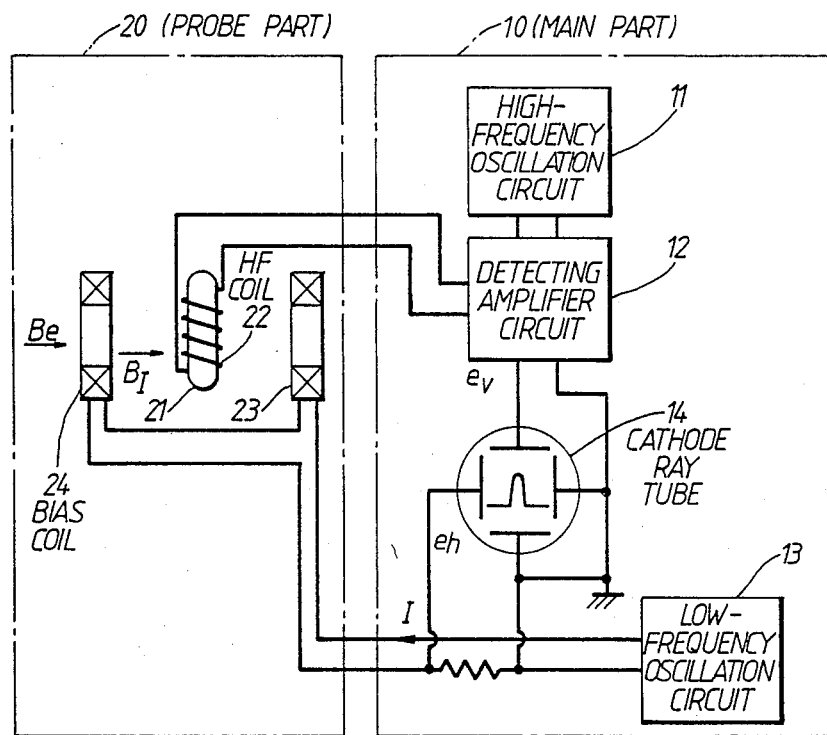
FIG. 10 is a circuit diagram of a known magnetic field measuring apparatus utilizing the magnetic resonance effect.
Figure 11:
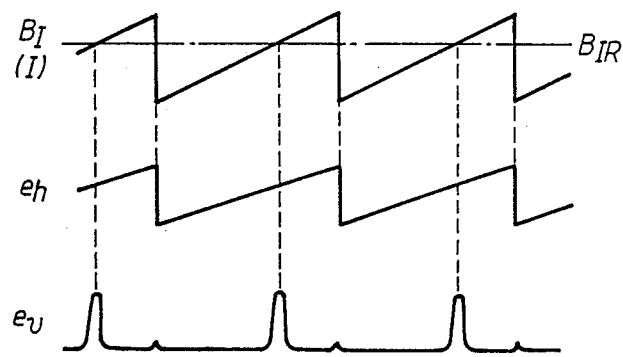
FIG. 11 is a timing diagram showing the timed relationship of $B_I$, $e_h$ and $e_v$ in FIG. 10.

In step 73, bias coil current reference $I_R$ is determined as described in reference to FIG. 8 and output to D.C. amplifier 18 through input/output circuit 101 and D/A converter 180. D.C. amplifier 18 supplies current corresponding to this $I_R$ to bias coils 23 and 24. Also in step 73, output $V_D$ of detecting amplifier circuit 17 resulting from a given application of bias coil current determined by $I_R$ is input to computing and control circuit 100 through A/D converter 170 and input/output circuit 101.

$I_R$ is varied by computing and control circuit 100 to find the point at which $V_D$ is a minimum. This point is the NMR resonance point. The details of NMR resonance point detection will be explained later with respect to FIGS. 8 and 9. The value of $I_R$ at which resonance is found to occur in step 73 is defined as $I_{RO}$.

In step 74, the frequency of the output of high-frequency oscillator circuit 16 is input to computing and control circuit 100 through frequency counter circuit 19 and input/output circuit 101. As described above, this frequency counter circuit 19 is capable of measuring frequency with the high accuracy of 7 decimal figures. To carry out this frequency measurement, first of all, in FIG. 4 described above, counter reset signal r is output from channel 1 of input/output circui 101, then count start signal S is output. In response to this, a pulse $P_2$ of a certain time width is output from monostable circuit 192 (FIG. 4), and the number of pulses obtained when AND gate 193 gates the shaped high-frequency signal v obtained during the ON period of this pulse $P_2$ is counted. This count represents the measured frequency of the signal v output from high-frequency oscillator 16.

In step 75, if we let this measured frequency be $f_{RO}$, using equations (1) and (2), $$B_o = A \times f_{RO} \tag{7}$$
$$= B_e + B_{IRO}$$

so the value of the external magnetic field $B_e$ that is to be measured, (i.e. the value of the magnetic field that is applied from the outside to high-frequency coil 22 and bias magnetic field coils 23 and 24) is calculated from:

$$B_e = A \times f_{RO} - B_{IRO} \tag{8}$$

where $B_{IRO}$ is the magnitude of the bias magnetic field obtained using $I_{RO}$, and is given by:

$$B_{IRO} = b \times I_{RO} \tag{9}$$

where b is a constant determined by the inductance and shape of bias magnetic field coil 23, and may be determined, for example, by calibration. The calculated value of $B_e$ is output from computing and control circuit 100 through input/output circuit 101 to display circuit 102, which displays its value digitally.

The details of the resonance detection part of step 73 (FIG. 7) will now be described with reference to FIG. 8 and FIG. 9.

Before continuing, certain things must be understood concerning a maximum value $I_{max}$ and a minimum value $I_{min}$ of the bias magnetic field coil current. Specifically, if the accuracy of detection of Hall element magnetic field detecting circuit 15 (FIG. 1) is taken as $\pm 0.1\%(10^{-3})$ with respect to the maximum measurable value $B_m$ of the magnetic field, then $I_{max}$ and $I_{min}$ are determined as follows:

$$I_{max} = (1/b) \cdot B_m \times 10^{-3} \tag{10}$$

$$I_{min} = -(1/b) \cdot B_m \times 10^{-3} \tag{11}$$

That is to say an adjustment of up to $\pm 10^{-3}$ can be achieved by altering the current of bias magnetic field coil 23 between $I_{min}$ and $I_{max}$. In step 80 of FIG. 8, we therefore set $I_1 = I_{min}$.

Step 81 is the part where a value delta I is calculated. Here $$\text{delta } I = (I_{max} - I_{min})/4 \tag{12}$$

is calculated, and n is set equal to 1. Delta I represents the difference between adjacent values of current to be consecutively applied to bias coils 23 and 24 (FIG. 1). The variable n is a running index keeping track of which iteration in the following loop 82–86 is being executed.

In step 82, the value of $I_n$ is output as bias coil current reference $I_R$ through input/output circuit 101 and D/A converter 180. Step 83 is a time delay in which the processor waits for the time required for the value of the bias coil current to become constant. In step 84, output $V_D$ of detecting amplifier 17 is input, and a variable $V_{Dn}$ takes on this value, $V_D$. This variable, $V_{Dn}$ therefore represents values of inductances of high-frequency coil 22 for various bias magnetic field magnitudes.

Next, control shifts to step 85, which ascertains whether or not n is 5 or less. If n is 5 or less ("Yes"), then step 86 calculates $I_{n+1} = I_n + \text{delta } I$, and adds 1 to the value of n to obtain a new n. After step 86, control shifts to step 82, and the processes described above are repeated a total of 5 times to cover a range of values of current output to bias coils 23 and 24.

If in step 85 n is greater than 5 ("NO"), control shifts to step 87, which finds which of $V_{D1}, V_{D2}, \ldots V_{D5}$ is smallest, and takes this minimum value as $V_{DM}$ (where M is some number between 1 and 5). Taking $I_M$ as that one of the values $I_1$ to $I_5$ that gives $V_{DM}$, in step 88, $I_{min}$ and $I_{max}$ can be re-written as follows:

$$I_{min} = I_M - \text{delta } I \quad (13)$$

$$I_{max} = I_M + \text{delta } I \quad (14)$$

In step 89 it is ascertained whether delta I is less than predetermined accuracy parameter delta $I_{min}$. If delta I is in fact greater than delta $I_{min}$ ("NO"), then the operations from step 80 onwards are repeated as described above. If delta I is less than delta $I_{min}$ ("Yes"), the processing of the resonance detection terminates. By these operations, the point at which $V_D$ becomes a minimum (i.e. the resonance point) can be found.

Figure 9:
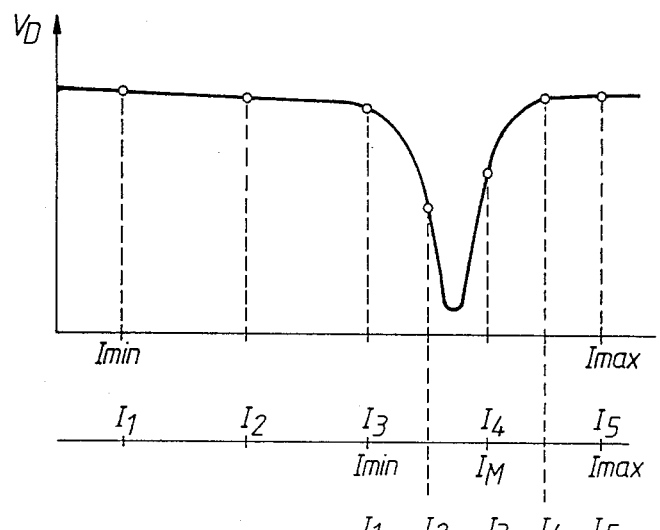
FIG. 9 is a diagram showing how the resonance point is detected, where the horizontal axis is the current applied to bias coils 23 and 24 (FIG. 1), and the vertical axis is the resultant voltage detected by detecting amplifier circuit 17 (FIG. 1) as being indicative of the inductance of high-frequency coil 22.

What happens in the process described mathematically with respect to FIG. 8 is shown diagrammatically in FIG. 9. Specifically, the interval between $I_{max}$ and $I_{min}$ is divided into 4 subintervals of size delta I. Of the points $I_1, I_2, I_3 \ldots I_5$ resulting from this division into 4 subintervals, the point (say, $I_4$) that gives the minimum value of $V_D$ is found. From this it can be seen that the minimum must lie between the points $I_3$ and $I_5$ that comes immediately before and after $I_4$ respectively.

Next, taking $I_3$ and $I_5$ as the new $I_{min}$ and $I_{max}$, a "fresh" set of $I_1, I_2, \ldots I_5$ is found in the same way. Suppose that of these the point giving the minimum value of $V_D$ is the "fresh" value of $I_2$. It can then be seen that the minimum of $V_D$ must lie between the "fresh" points $I_1$ and $I_3$ that come before and after it respectively. Thus the actual minimum can be approached by successive approximation. The minimum is regarded as having been detected when the magnitude of delta I becomes smaller than the predetermined accuracy parameter delta $I_{min}$.

Incidentally, it should be pointed out that the reason why, in the explanation of FIG. 7, FIG. 8 and FIG. 9, the resonance point appears as a minimum value is that a bridge circuit is used in the detecting amplifier circuit 17 (FIGS. 1 and 3). If, alternatively, it were to be constructed as a simple resonance circuit, the point of resonance would appear as a maximum value.

CONCLUSION

Thus, in present invention, a value $V_H$ representative of the magnitude of the magnetic field is detected with the accuracy achievable by Hall element 25 and Hall element magnetic field detection circuit 15. A first approximation of the frequency $f_R$ at which magnetic resonance should occur is found from this value $V_H$. High-frequency voltage signal v at this frequency is then generated from high-frequency oscillator circuit 16.

However, the frequency that is actually generated will include some error (resulting from inaccuracies in $V_H$ and the high-frequency oscillator), so the exact frequency of magnetic resonance will not in fact necessarily be obtained. Accordingly, by varying the current through bias coils 23 and 24, the bias coil current for which magnetic resonance occurs is determined, with the aid of computing and control circuit 100. This bias current value is the point which causes the signal $V_D$ from detecting amplifier circuit 17 to be a minimum. The frequency of the output of high-frequency oscillator circuit 16 is then accurately found using high-frequency counter circuit 19. The magnetic field that is to be detected can then be accurately calculated by computing and control circuit 100 from this frequency and the current of the bias coil, and can then be displayed using display circuit 102.

Since the operation of present invention is performed under the control of a program executed by a microprocessor provided in computing and control circuit 100, measurements can be performed at regular intervals. The measurement of the magnetic field can be performed automatically and displayed in real time. Also, the measurements can be obtained more rapidly than with known measurement systems.

The present invention embraces embodiments other than the particular embodiment described above. For example, magnetic field detection means other than Hall element 25 and Hall element magnetic field detection circuit 15 may be employed. Also, detection means other than a bridge circuit may be used in detecting amplifier 17 to detect inductance variation or resistance variation of high-frequency coil 22 at the magnetic resonance point. Furthermore, by using minimum value (or maximum value) detection methods in place of those described with reference to FIG. 8 and FIG. 9, detection of magnetic resonance may still be performed. Thus, although several particular embodiments have been described, the scope of the invention should not be limited to those enumerated above, but should be defined only in accordance with the following claims.

What is claimed is:

1. An apparatus for measuring an external magnetic field, comprising:
   (a) a high-frequency coil for measuring said external magnetic field by detecting a nuclear magnetic resonance (NMR) effect, said coil having a variation of inductance depending on the presence or absence of said NMR effect;
   (b) bias means for generating a bias magnetic field to be superimposed on said external magnetic field;
   (c) an ancillary magnetic field measuring means;
   (d) a high-frequency generating means for generating a high-frequency voltage and applying said high-frequency voltage to said high-frequency coil;
   (e) a frequency computing means for computing the frequency of said high-frequency voltage to be applied to said high-frequency coil on the basis of a magnetic field measurement from said ancillary magnetic field measuring means;
   (f) a bias current means for varying, in a predetermined range, a bias current which flows through said bias means, and supplying said bias current to said bias means;

(g) a resonance point sensing means for sensing the bias current for which the variation of inductance of said high-frequency coil is a maximum;

(h) a magnetic field computing means for computing the magnitude of said external magnetic field from the bias current for which said inductance variation is a maximum and from the frequency of said high-frequency voltage; and (i) a display means for displaying said magnitude of said external magnetic field.

2. The magnetic field measuring apparatus as defined in claim 1, wherein said ancillary magnetic field measuring means comprises:
a Hall element; and
a Hall element magnetic field detector which supplies a current to, and inputs a Hall voltage from, said Hall element.

3. The magnetic field measuring apparatus as defined in claim 1, wherein said bias current means comprises:
means for dividing said predetermined range into a plurality of subintervals, said bias current means supplying bias current of different magnitudes determined by the edges of said subintervals;
means for determining which of the bias current values produces more variation of inductance than any other bias current values supplied by said bias current means; and
means for defining new ranges which are centered about said value of bias current which produces more variation of inductance than any other bias/-current values heretofore supplied by said bias current means, and which have new range widths progressively smaller than said predetermined range.

4. An apparatus for measuring an external magnetic field, comprising:
an ancillary magnetic field measuring means having a predetermined accuracy capability for providing a first magnetic field estimate;
bias range determination means which uses said first magnetic field estimate and said accuracy capability to define a range of bias values;
bias application means, responsive to said range of bias values, for superimposing a corresponding range of bias magnetic fields onto said external magnetic field, so as to cause nuclear magnetic resonance in a substance disposed in both said external magnetic field and a resonance bias magnetic field contained within said range of bias magnetic fields, said resonance bias magnetic field caused by a resonance bias value obtained in said range of bias values; and
magnetic field computing means for computing the magnitude of said external magnetic field based on which bias value in said range of bias values is said resonance bias value which causes said nuclear magnetic resonance.

5. The magnetic field measuring apparatus as defined in claim 4, wherein said bias range determination means further comprises:
frequency computing means computing a frequency of a high-frequency voltage to be applied to a high-frequency coil on the basis of said first magnetic field estimate from said ancillary magnetic field measuring means; and
inductance sensing means for sensing the inductance of said high-frequency coil.

6. The magnetic field measuring apparatus as defined in claim 5, wherein:
said bias values comprise bias currents;
said bias application means comprise bias coils to which said bias currents are applied; and
wherein said bias coil produce different magnitudes of said bias magnetic field corresponding to different values of said bias currents.

7. The magnetic field measuring apparatus as defined in claim 6, wherein said magnetic field computing means further comprises:
frequency counting means for determining a resonant frequency value of said high-frequency voltage;
means for receiving said determined resonant frequency value of said high-frequency voltage from said frequency counting means;
means for processing said resonant frequency value and said resonance bias value to compute the magnitude of said external magnetic field; and
means for presenting said computed magnitude of said external magnetic field to a display means.

8. The magnetic field measuring apparatus has as defined in claim 4, wherein said bias range determination means comprises:
means for dividing said bias value range into a plurality of subintervals, said bias application means supplying bias magnetic fields of different magnitudes determined by the edges of said subintervals;
means for determining which of the bias values in said bias value range is closest to said resonance bias value; and
means for defining new ranges centered about said value of bias current closest to said resonance bias value and having new range widths progressively smaller than the width of said range of bias values originally defined.

9. A method for measuring an external magnetic field, comprising the steps of:
disposing in said external magnetic field a substance capable of displaying nuclear magnetic resonance;
surrounding said substance with a high-frequency coil;
measuring said external magnetic field to a certain degree of accuracy with an ancillary magnetic field measuring technique to produce a first estimate of the magnitude of said external magnetic field;
determining from said first estimate of said external magnetic field an estimated magnetic resonance frequency;
applying a high-frequency voltage of said estimated magnetic resonance frequency to said high-frequency coil;
determining from said first estimate of the magnitude of said external magnetic field a range of values of bias coil currents to apply to bias coils surrounding said substance to cause nuclear magnetic resonance in said substance;
applying said bias coil currents;
measuring resultant variation in inductance of said high-frequency coil;
determining the bias coil current for which the variation of inductance of said high-frequency coil is a maximum;
computing the magnitude of said external magnetic field with at least as much accuracy as said first estimate of said magnitude, using the frequency of the high-frequency voltage and using the values of the one of said bias currents for which the variation of inductance of said high-frequency coil is a maximum; and displaying said magnitude of said external magnetic field.

10. The method according to claim 9, wherein
said steps of determining a range of values, applying bias coil currents, measuring resultant variation, and determining bias coil current maximizing inductance variation are iteratively repeated; and wherein said range of values decreases in size with each iterative repetition until a predetermined accuracy threshold is attained.

* * * * *